(12) United States Patent
Dansberg et al.

(10) Patent No.: US 7,679,720 B2
(45) Date of Patent: *Mar. 16, 2010

(54) APPARATUS CONFIGURED TO POSITION A WORKPIECE

(75) Inventors: Michel Pieter Dansberg, Eindhoven (NL); Sebastiaan Maria Johannes Cornelissen, Eindhoven (NL); Henrikus Herman Marie Cox, Eindhoven (NL); Robert Johannes Petrus Van Diesen, Oirschot (NL); Nicolaas Rudolf Kemper, Eindhoven (NL); Robert-Han Munnig-Schmidt, Hapert (NL); Harmen Klaas Van der Schoot, Vught (NL); Rob Jansen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 161 days.

This patent is subject to a terminal disclaimer.

(21) Appl. No.: 12/068,071

(22) Filed: Feb. 1, 2008

(65) Prior Publication Data

US 2008/0174750 A1    Jul. 24, 2008

Related U.S. Application Data

(63) Continuation of application No. 10/925,148, filed on Aug. 25, 2004, now Pat. No. 7,359,032.

(30) Foreign Application Priority Data

Aug. 29, 2003    (EP)  .................................. 03077701

(51) Int. Cl.
    G03B 27/42    (2006.01)
    G03B 27/58    (2006.01)
    G03B 27/62    (2006.01)
    H02K 41/00    (2006.01)

(52) U.S. Cl. ............................. 355/53; 355/72; 355/75; 310/12

(58) Field of Classification Search ................... 355/30, 355/53, 72–76, 77; 310/10, 12, 58; 250/492.1; 356/401; 451/59
See application file for complete search history.

(56) References Cited

U.S. PATENT DOCUMENTS 5,907,390 A    5/1999    Sakamoto (Continued)

FOREIGN PATENT DOCUMENTS

EP    0 242 178    10/1987

(Continued)

OTHER PUBLICATIONS

Japanese Office Action issued for Japanese Patent Application No. 2004-247637, dated Oct. 2, 2007.

(Continued)

*Primary Examiner*—Hung Henry Nguyen
(74) *Attorney, Agent, or Firm*—Sterne, Kessler, Goldstein & Fox P.L.L.C.

(57) ABSTRACT

An apparatus is configured to position a workpiece. The apparatus includes a planar base, and a movable stage configured to support the workpiece. The stage is configured to be moved over the planar base. The apparatus also includes an actuator configured to move the stage, a contactless position measurer configured to measure a position of the stage, and a first pump configured to generate a conditioned gas flow in a volume between the measurer and the stage. The base includes a plurality of gas channels provided in the base that provide a path of the conditioned gas flow through the base.

15 Claims, 5 Drawing Sheets

U.S. PATENT DOCUMENTS

| | | | |
|---|---|---|---|
| 5,997,963 | A | 12/1999 | Davison et al. |
| 6,114,781 | A | 9/2000 | Hazelton et al. |
| 6,228,544 | B1 | 5/2001 | Ota |
| 6,445,093 | B1 | 9/2002 | Binnard |
| 6,528,907 | B2 | 3/2003 | Hwang et al. |
| 6,542,220 | B1 | 4/2003 | Schrijver et al. |
| 6,841,965 | B2 * | 1/2005 | Lee ............................ 318/649 |
| 7,359,032 | B2 * | 4/2008 | Dansberg et al. .............. 355/53 |
| 2002/0045113 | A1 | 4/2002 | Pril et al. |
| 2004/0223133 | A1 | 11/2004 | Miyajima et al. |

FOREIGN PATENT DOCUMENTS

| | | |
|---|---|---|
| EP | 1 243 972 A1 | 9/2002 |
| JP | 10-209040 | 8/1998 |
| JP | 10-256356 | 9/1998 |
| JP | 11-304425 | 11/1999 |
| WO | WO 01/84241 A1 | 11/2001 |

OTHER PUBLICATIONS

Partial European Search Report, App. No. EP 03 07 7701, mailed Jun. 23, 2004, 5 pgs.

European Search Report, App. No. EP 03 07 7701, mailed Aug. 26, 2004, 2 pgs.

* cited by examiner

APPARATUS CONFIGURED TO POSITION A WORKPIECE

CROSS-REFERENCE TO RELATED APPLICATIONS

This application is a continuation application of U.S. patent application Ser. No. 10/925,148, filed Aug. 25, 2004, now U.S. Pat. No. 7,359,032 which claims the benefit of priority from European patent application number 03077701.5, filed Aug. 29, 2003, the entire contents of which are incorporated herein by reference.

FIELD

The present invention relates to an apparatus configured to position a workpiece.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction. The light source can be UV, DUV, EUV-light or an electron beam.

In the lithographic apparatus as hereabove described, a common problem is how to create a stable and conditioned environment for the position measuring devices that are used to locate and position the stage relative to the base. Such a contact-less measurement device is typically an interferometer, however, other devices such as optical or capacitive rulers (encoders) can also be applied. Here, the stage is used, for example, for holding a target substrate thereon; in order to illuminate the target substrate in synchronicity with a movable patterning device, the substrate is moved in a scan direction, and the precise positioning and alignment relative to the patterning device usually takes place in a closed loop control in which the position of the stage is measured by interferometric measurement and adapted in response to the measurement. Oftentimes, position measurement devices are used that are very sensitive for variations of the media through which a position measurement is performed. For example, for an interferometer, a variation of the refractive index in the media is directly translated in a deviation of a measured position of the stage. Therefore, the media, and in particular the media in the volume that is present between the measuring device and the movable stage, should be kept stable. For an interferometer, the media should be kept at a stable and predictable variation of the refractive index, which is known to be sensitive to gas composition, pressure and temperature fluctuation. In general, the variation is preferably kept at a near-zero level.

In order to provide a stable media environment for letting a measurement beam pass through, a known concept is the so-called "air shower." This is a gas stream of a conditioned, in particular, thermo-conditioned, pressure regulated and/or purified gas mixture that is ejected in the path that a measurement beam travels in the measurement setup. In the remainder, the term "air" will be used to indicate gas media that are used in the environment of the base and stage. This gas media may be ambient air, possibly conditioned and purified. However, also other gas media, such as pure nitrogen, may be included by this term and the invention is not restricted to air showers with ambient air.

It has been found that the conventional setup of a moving stage disturbs these air showers and more particularly, that there is a need to further improve the media environment conditions in the volume between the measuring device and the stage, in order to comply with the ever increasing demand for higher accuracy.

SUMMARY

It is an aspect of the present invention to provide a lithographic apparatus in which these media environment conditions are further improved so that a more reliable position measurement may be performed.

In an embodiment, a lithographic apparatus is provided. The apparatus includes a radiation system for providing a beam of radiation, and a first support structure for supporting a patterning device. The patterning device serves to pattern the beam of radiation according to a desired pattern. The apparatus also includes a second support structure for supporting a substrate, and a projection system for projecting the patterned beam onto a target portion of the substrate. The first and/or second support structures include a planar base, a movable stage for supporting the patterning device or the substrate, respectively, that can be moved over the planar base, and an actuator for providing the movement of the stage. The apparatus also includes a contactless position measuring device for performing a position measurement of the stage, and a first pump for generating a conditioned gas flow in a volume between the measuring device and the stage for improving the position measurement. A plurality of gas channels are provided in the base in order to provide a gas flow path of the gas flow through the gas channels in the base.

With this configuration, there is essentially no bouncing back of gas streams that "bounce" on the base. Bouncing back normally creates turbulence so that the gas flow of conditioned gas is intermingled with surrounding gas, which may be polluted due to minor particles that come off moving parts of the apparatus and/or due to heating up from various items, such as a motor configuration for actuating the stage. In particular, since the stage moves during operation, it is desirable to have these gas streams as laminar as possible, since the movement of the stage provides additional disturbance of the gas stream.

In an embodiment, the gas channels may be connected to a second pump for removing gas from the channels. The stage may further be provided with a third pump, for removing gas from between the stage and the base. Such a configuration may be particularly useful if any of the pumps are arranged to provide a gas flow speed that between the stage and the base that is higher than the maximum speed of the stage on the base. Thus, even when a stage is moved across the base of the support structure, gas that is warmed up between the stage and the base, for example, due to heat production of an actuating motor, is trapped under the stage and is extracted so that it cannot influence the temperature conditions of the media environment wherein the measurement beam travels.

Further, the gas channels in the base may be provided with valves arranged to close due to suction of the third pump. Such an arrangement is convenient for developing a vacuum pressure between the stage and the base, for example, in a so called "air foot" configuration, which will be described later.

Furthermore, the gas channels may be provided in a regular pattern across substantially the whole planar base. Such a regular pattern preferably has a fine pitch. In this way, the flow path of the air shower may be independent of a relative position of the stage on the base.

In an embodiment, any of the pumps may be connected so as to provide a closed-loop air shower. This embodiment may provide the benefit that the air is already preconditioned before use, so that the load for cooling and purification devices is reduced. Here, the base and the stage are preferably contained in a closed environment in which cooling and/or purifying devices are coupled between any of the pumps.

The gas flow may be oriented perpendicular to the base. The measuring device may be an interferometer providing a measuring beam parallel to the base. In this way, the air shower may be unaffected by the movement of the stage.

In an embodiment, the actuator may include a planar electro magnetic motor. Such an arrangement may offer an advantage of an improved position accuracy of the control of the planar movements of the stage, in particular, the possibility to provide a stage movement with up to six degrees of freedom. However, as a drawback, such actuator arrangements may produce a significant amount of heat due to the energy generated in the electric wiring. This heat may affect the reliability of the measuring devices that are used for providing position information of the stage, which may result in a loss of imaging resolution. For details of a particular setup for a magnetic motor, reference is made to the European patent EP-A-1243972, the contents of which are incorporated herein by reference.

In an embodiment, the planar magnetic motor includes a stator coupled to the base, and a translator that is movable relative to the stator and coupled to the stage in order to provide a movement of the stage by electromagnetic forces wherein at least one of the stator and the translator includes a grid of magnets and/or electric wiring in which the gas channels are provided on preselected corners of the grid.

In an embodiment, the stage may be provided with a further pump in order to provide an air bearing between the stage and the base. Such an arrangement is also known as an "air foot," enabling an in-plane bearing with 3 degrees of freedom (3DoF). Such a bearing may be with or without a planar magnet motor arrangement, as described above.

In an embodiment, a planar magnetic motor is provided. The planar magnetic motor includes a stator, and a translator movable relative to the stator in order to provide a relative movement of the translator to the stator by electromagnetic forces. Gas channels are provided in the stator and/or the translator, in order to provide a gas flow path for removing heated air from between the stator and the translator. The gas channels are connectable to a pump.

In an embodiment, a device manufacturing method is provided. The method includes patterning a beam of radiation with a patterning device supported by a first support structure, projecting the patterned beam of radiation onto a target portion of a substrate supported by a second support structure, measuring a position of a movable stage of the first support structure and/or the second support structure with a measuring device, and pumping a conditioned gas flow in a volume between the measuring device and the stage and through a plurality of gas channels in a base of the first support structure and/or the second support structure.

In an embodiment, a stage assembly, and measuring device therefor, for a lithographic projection apparatus is provided. The stage assembly includes a base, a movable stage that can be moved across the base, a contactless position measuring device for measuring a position of the stage, and a pump for generating a conditioned gas flow in a volume between the measuring device and the stage. The base includes a plurality of gas channels that provide a path for the conditioned gas to flow through the base.

In an embodiment, an apparatus configured to position a workpiece is provided. The apparatus includes a planar base, and a movable stage configured to support the workpiece. The stage is configured to be moved over the planar base. The apparatus also includes an actuator configured to move the stage, a contactless position measurer configured to measure a position of the stage, and a first pump configured to generate a conditioned gas flow in a volume between the measurer and the stage. The base includes a plurality of gas channels provided in the base that provide a path for the conditioned gas flow through the base.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" as used herein encompass all types of electromagnetic radiation, including ultra-violet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device."

The term "projection system" as used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
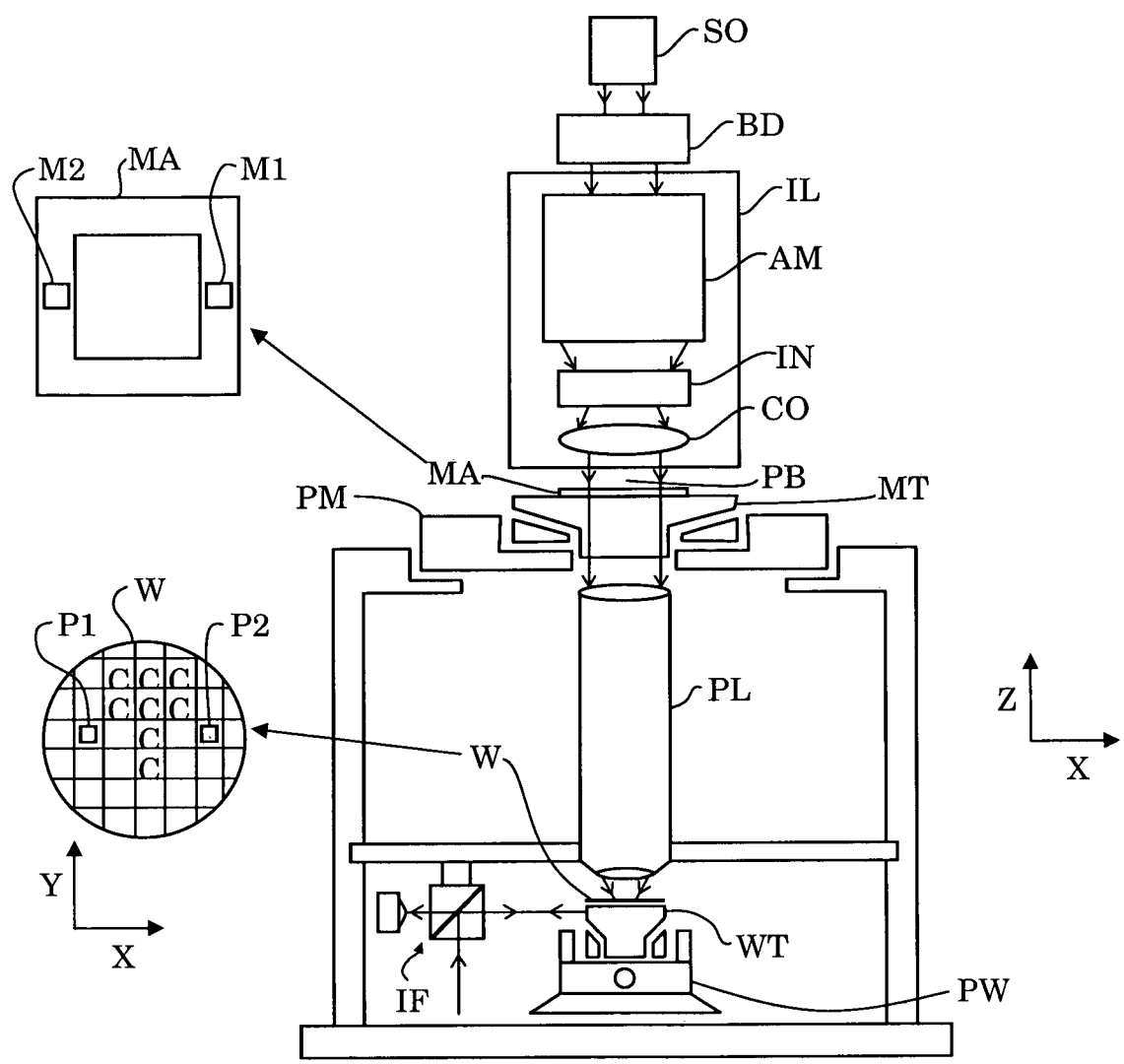
FIG. 1 depicts a lithographic projection apparatus according to an embodiment of the invention.

FIG. 1 schematically depicts a lithographic apparatus according to a particular embodiment of the invention. The apparatus includes an illumination system (illuminator) IL for providing a projection beam PB of radiation (e.g. UV radiation), a first support structure (e.g. a mask table) MT for supporting a patterning device (e.g. a mask) MA and connected to a first positioning device PM for accurately positioning the patterning device with respect to item PL, a substrate table (e.g. a wafer table) WT for holding a substrate (e.g. a resist-coated wafer) W and connected to a second positioning device PW for accurately positioning the substrate with respect to item PL, and a projection system (e.g. a refractive projection lens) PL for imaging a pattern imparted to the projection beam PB by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the apparatus, for example, when the source is a mercury lamp. The source SO and the illuminator IL, together with the beam delivery system BD if required, may be referred to as a radiation system.

The illuminator IL may include an adjusting device AM for adjusting the angular intensity distribution of the beam. Generally, at least the outer and/or inner radial extent (commonly referred to as s-outer and s-inner, respectively) of the intensity distribution in a pupil plane of the illuminator can be adjusted. In addition, the illuminator IL, generally includes various other components, such as an integrator IN and a condenser CO. The illuminator IL provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (1 to 6 degrees of freedom (DoF) coarse positioning) and a short-stroke module (for example, 6 DoF fine positioning), which form part of the positioning devices PM and PW. However, in the case of a stepper (as opposed to a scanner) the mask table MT may be connected to a short stroke actuator only, or may be fixed. The mask MA and the substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes the programmable patterning device, such as a programmable mirror array of a type as referred to above.

Combinations and/or variations on the above described modes of use or entirely different modes of use may also be employed.

Figure 2:
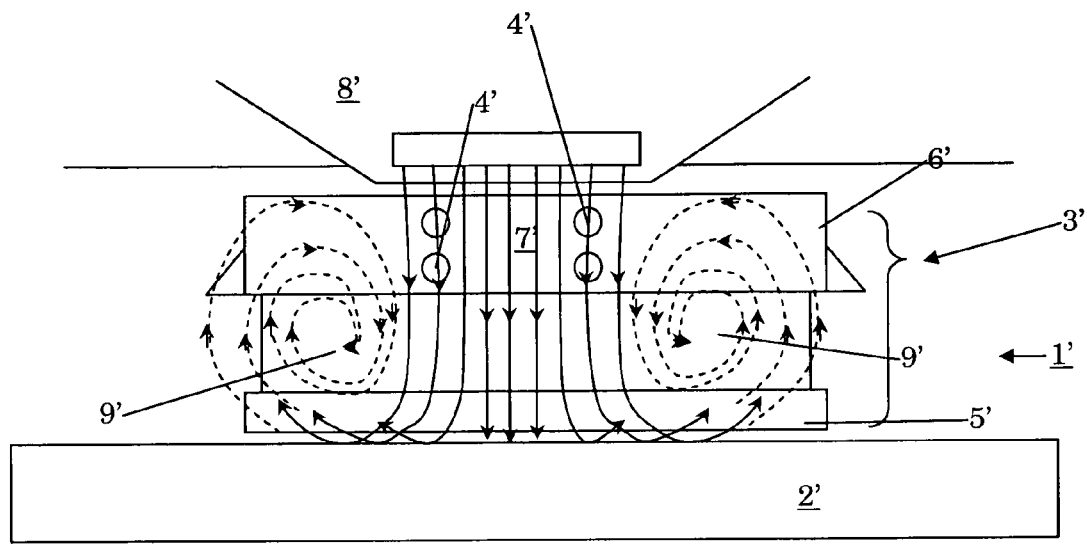
FIG. 2 shows a schematic of a conventional air shower setup for an interferometric measuring device.
Figure 3:
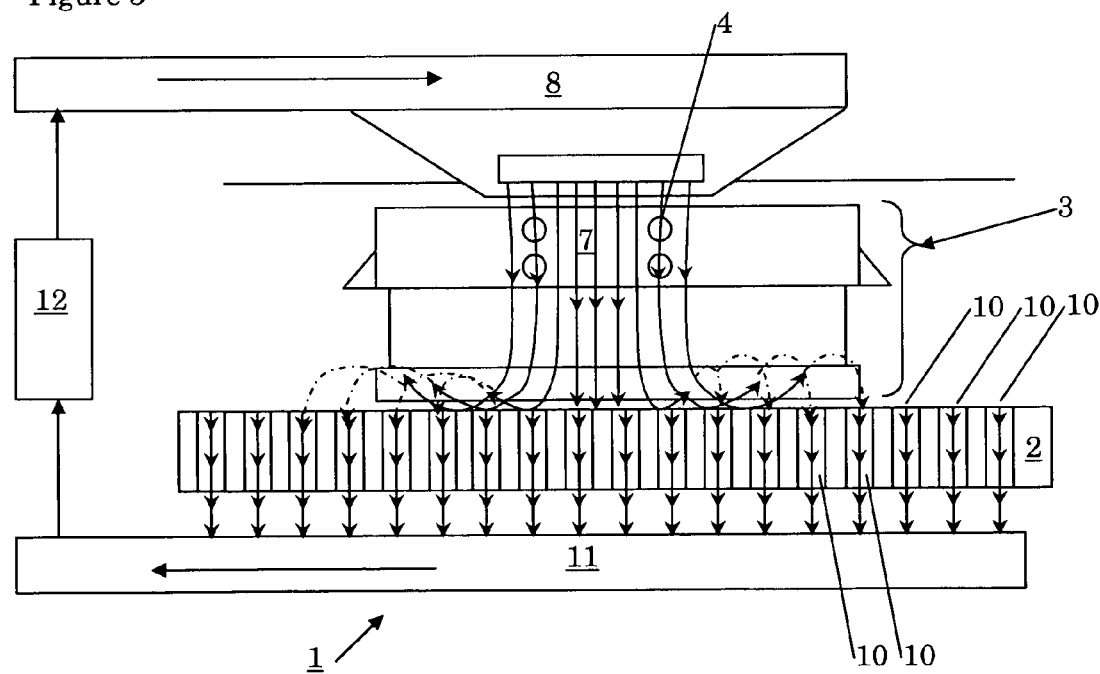
FIG. 3 shows a schematic of an air shower setup for the apparatus of FIG. 1.

In FIG. 2, a schematic face view is illustrated of a support structure 1', for supporting, for example, a wafer (not illustrated). The structure 1' includes a planar base 2' and a movable stage 3' that can be moved over the planar base 2' in at least three DoF. Schematically, by the dotted areas 4', measurement beams are indicated that measure a distance from a measurement device (not illustrated) to the movable stage 3'. In the embodiment shown, the movable stage 3' includes a lower part 5' and an upper part 6'. These parts 5' and 6' are usually actuated by different actuators. In particular, the lower part 5' is actuated by a coarse positioning device (not shown) and the upper part 6' is actuated by a fine positioning device (not shown). The measurement device is an interferometer that projects an interferometric measurement beam 4' onto the upper part 6', so that precise positioning information of the upper part 6' of the stage 3' can be obtained with, typically, a (sub)nanometer resolution. Since a wafer has a fixed positional relationship to this upper part 6' of the stage 3', the lithographic imaging can be performed at a very high resolution. In FIG. 2 and FIG. 3 a conventional air shower setup and an air shower setup according to the invention, respectively, are illustrated. In particular, in FIG. 2, a schematic gas flow 7' is illustrated of gas that is ejected from a pump 8', seen along the direction of the measurement beam 4'. The pump 8' projects the gas flow into the path of the measurement beam 4'. The gas flow 7' (generally referenced as "air shower") crosses the measurement beam 4' substantially perpendicularly and thereby creates a stable media environment for the measurement to travel through. Here, the media is kept at a relative constant composition, pressure and temperature, resulting a substantially constant refractive index. Since the refractive index of the media is substantially constant, a reliable position indication can be obtained; whereas a variation of the refractive index would have a direct consequence of the measured position.

For illustrative purposes, it can be shown that in a volume of 500×40×60 mm, a heat load of 12e-6 Watt already results in a 1.0 nm position error of a measured position of the stage 3'. Another factor of importance is the media pressure, which is preferably kept stable within 1.5 Pa for a 1.0 nm position error. Alternatively, a temperature variation of the media of 2.3 mK results in a measured 1.0 position error. This illustrates that keeping the environment stable is relevant for having a reliable position measurement of the stage 3'.

However, as FIG. 2 illustrates, the air shower 7' generated by the pump 8' is not able to create a stable media environment for the measurement beam 4', because the presence of the base 2', in addition to a movement of the stage 3' creates turbulence (indicated in the vicinity of arrow 9') of the gas flow of the air shower 7'. This turbulence 9' may be detrimental for the requirement of a stable media environment for the measurement beam 4' to travel through, which may result in an inferior image resolution of the lithographic process.

FIG. 3 shows an improved air shower 7 setup according to the invention. Here, the base 2 is provided with gas channels 10 (for clarity reasons, only a few of which are referenced in the figure), in order to provide a flow path for the air shower 7 through the base 2. The gas channels 10 are connected to an air pump 11 for creating a suction force to guide the flow path of air shower 7 through the gas channels 10. The gas channels 10 provide a flow path for the air shower 7 through the base 2, thereby minimizing turbulence through bouncing back of air streams that "bounce" on the base 2.

In the embodiment of FIG. 3, a closed-loop air shower arrangement is illustrated, where the air pump 11 is connected via a cooling/and or purifying device 12 between the pump 11 and the pump 8. In this way, the air is already preconditioned before use, so that the load for cooling and purification device 12 is reduced.

Figure 4:
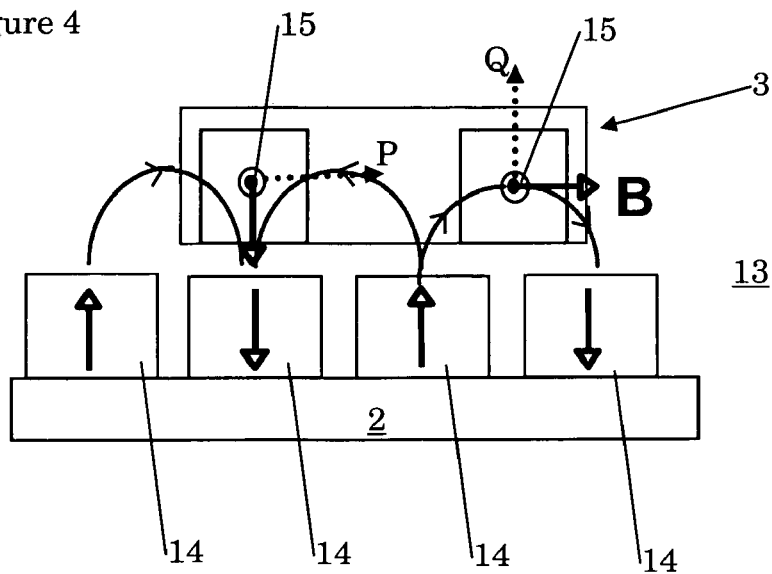
FIG. 4 shows a schematic of a force element of a planar magnetic motor setup for the apparatus of FIG. 1.

The invention may be particularly useful in the context of an embodiment including an actuator that generates a lot of heat in the area of the measurement beams, since this heat can be usefully extracted through the gas channels 10 provided in the base 2 of the support structure 1. However, the invention may also be used to remove heat from other heat sources, such as heat sources from tubing and wiring connected to the stage 3. For example, FIG. 4 shows a schematic view of an actuator, specifically, a magnetic planar motor 13. Such a motor 13 is able to actuate (in 3 DoF or 6 DoF) the stage 3 in a plane generally parallel to the planar base 2 over which the stage 3 moves. According to one embodiment of a planar magnetic motor 13, the base 2 is covered by a matrix of magnet elements 14. These may be electromagnetic coils, or, such as is depicted in FIG. 4, permanent magnets having an alternating pole orientation, thus providing a checkerboard pattern. The magnetic flux lines (indicated by arrows reference by letter B and curved arrows) of the magnets 14 provide a magnetic field in which a current conductor senses an electromagnetic force. In the embodiment shown, it is illustrated how two current conducting wires 15 (in which the shown current flows towards the viewer in a direction perpendicular to the plane of view) spaced apart having a spacing equal to the core-core distance of the magnets 14, can provide an in-plane force in a first direction (referenced by arrow P) and a lifting force (referenced by arrow Q) for lifting the stage 3 from the base 2. For a planar motor, the shown wires 15 have cross-oriented counterparts (not shown) for providing an additional force in a direction orthogonal to the first direction, as well as an additional lifting force. Thus, by a combination of a sufficient number of these wirings 15 and their crossed counterparts, a wiring arrangement is provided in the stage 3 to provide a (3 DoF up to 6 DoF) movement of the stage 3 by electromagnetic forces.

Figure 5:
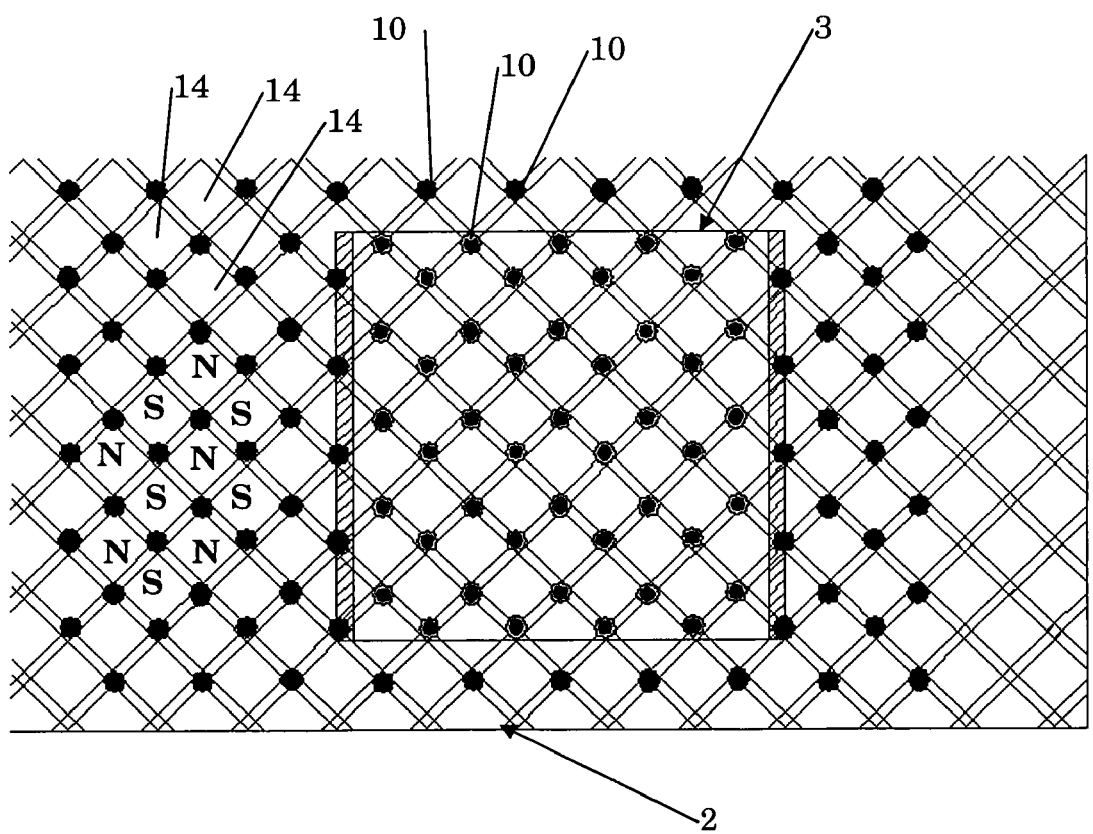
FIG. 5 shows a schematic of an gas channel configuration for the planar magnetic motor setup of FIG. 4.

FIG. 5 shows a partial plane view of the base 2 for the magnetic planar motor as described with reference to FIG. 4. The base 2 is covered with a diagonally oriented checkerboard pattern of magnets 14 having alternating poles (schematically indicated by "N" for North pole and "S" for South pole on selected positions). On the corners of the magnets 14, gas channels 10 are provided of about 2-5 mm diameter. In total, in base 2, about 100-1000 gas channels are present. In FIG. 5, the stage 3 is schematically illustrated. The gas channels 10 that are covered by the stage 3 are greyed. In an embodiment, the flow resistance of the gas channels 10 and the suction pressure of the pump 111 are so arranged that the gas flow speed between the stage 3 and the base 2 is higher than the maximum speed of the stage on the base, the scan speed being normally in the order of 0.1 up to 2 m/s. However, the maximum speed is preferably not higher than 20 m/s in order to prevent turbulence due to the high flow velocity (whistle). By keeping the gas flow speed higher than the scan speed at a value of, for example, 4 m/s, the heated air between the stage 3 and base 2 is "trapped" and extracted and does not escape to pollute the temperature controlled media environment in the vicinity of the measurement beam 4. To generate a sufficient air-extraction flow (of ca. 100-2000 m$^3$/hr, depending on extraction concept), a low vacuum (100-5000 Pa) may be applied. In the air shower according to the invention, approximately 90% of all supplied air may be removed via the gas channels 10 in the base 2 at an extraction flow of 1000 m$^3$/hr. The air shower of the present invention is much less sensitive to collisions, turbulence, and shear off of heated air. The top down air-flow will better maintain its laminar character, because there is no collision with and bouncing back from the floor.

Figure 6:
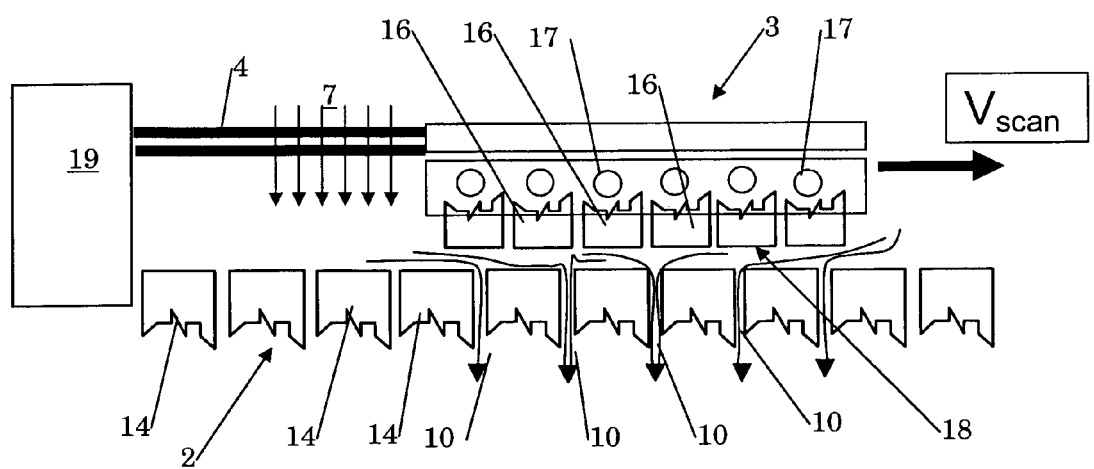
FIG. 6 shows a schematic of an embodiment according to the invention for a lithographic apparatus including a planar magnetic motor.

FIG. 6 shows an embodiment according to the invention for a lithographic apparatus that includes a planar magnetic motor. In this embodiment, a movable stage 3 is actuated via coils 16 that are provided in the stage 3. The coils 16 include a wiring arrangement, as discussed with reference to FIG. 4, so as to provide a stage that is movable in a plane parallel to the base 2. Since the plurality of coils 16 may be controlled independent of each other, in addition to movement in a plane and movement out of the plane, tilting movements of the stage 3 may also be provided, thereby offering six degrees of freedom. These coils 16 produce a heat load in the order of several kW, which results in a temperature of several tens of degrees higher than the target temperature of the media environment of the measurement beam, even after cooling by a channel system of water cooling ducts 17 that are provided in the stage 3. As an example, such a heat production may be in the order of 1-4 kW, which gives rise to a stage temperature of 50° C. near the surface 18 of the stage 3 facing the base 2. Consequently, the air may heat up significantly above a target temperature of 22° C. By providing a gas flow through gas channels 10 in the base, the heated air is trapped between the surface 18 and the base 2 and does not contaminate the stable media environment for the interferometric measurement beam 4 originating from and reflecting towards the interferometer 19 that is part of a projection optics frame (not shown).

Figure 7:
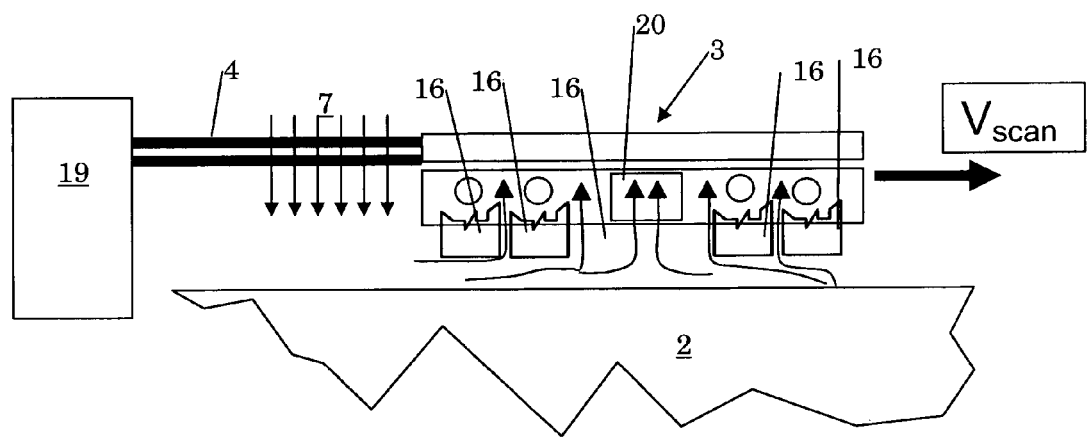
FIG. 7 shows a schematic of an embodiment according to the invention for a lithographic apparatus including a planar magnetic motor.

FIG. 7 shows an embodiment for a planar magnetic motor configuration having a planar base 2 provided with a matrix arrangement of magnets (not shown), and a stage 3 that is movable with respect to the base 2 and being provided with an electric coil 16 arrangement in order to provide a movement of the stage 3 by electromagnetic forces. According to the invention, the stage 3 is provided with a pump 20 for removing heated air from between the stage and the base. The pump 20 may include a pump that is located on stage 3, or a pump that is located at a place remote from the stage and connected through a flexible hosing (not shown). Although FIG. 7 is illustrated without gas channels present in the magnetic plate, the skilled person will understand that an embodiment where these gas channels are present in addition to the shown exhaust of the stage equally falls within the scope of the invention. In the same manner as explained above with reference to FIG. 6, the flow speed of the exhaust is chosen so as to confine the heated air between the stage 3 and base 2, so that the media environment for the interferometric measurement beam 4 is kept at a stable temperature.

Figure 8:
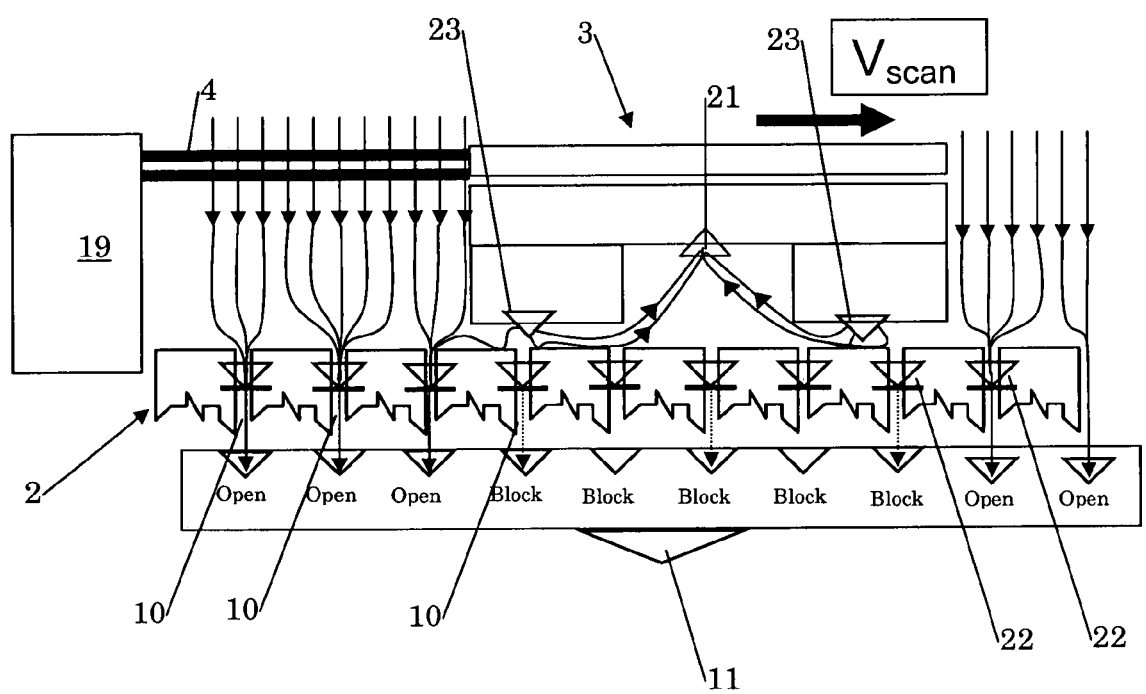
FIG. 8 shows a schematic of an embodiment for a lithographic apparatus according to the invention.

FIG. 8 shows an embodiment of the invention for a different type of actuator than the previously illustrated magnetic planar motor embodiments. The actuator illustrated in the embodiment of FIG. 8 uses a "conventional" air foot construction with 3 DoF in plane (Z-Rx, Ry) direction bearing and 3 DoF (X, Y, Rz direction) actuation, provided with the advantageous gas channels 10 provided in the base 2 as explained hereabove. However, an "air foot" uses a second pump 21 for removing gas from between the stage and the base in order to provide a stable support structure for the stage 3. In the embodiment of FIG. 8, this creates a local vacuum pressure that clamps the stage to the base and thus keeps it substantially in a plane parallel to the base. In order to prevent the local vacuum pressure from building up from air that enters the gas channels 10 from the "wrong side," the gas channels 10 are provided with valves 22, e.g. ball valves, that only permit one-way circulation of gas flow. The valves are connected to a flow path that flows to a pump such as a suction pump 11 or the like.

The air foot configuration may also include a pump 23 in order to provide an air bearing between the stage 3 and the base 2. Here, the suction pressure of the second pump 21, the suction pressure of the pump 11, the air pressure generated by the pump 23, and the flow resistance of the opening gas channels and the space between the stage 3 and base 2 are balanced in a way that the air foot is born by the air bearing provided by pump 23 and clamped by suction pump 21, while the valves are shut closed when the stage 3 is above the gas channels 10. This is schematically indicated by the term "block" in FIG. 8. On the other hand, for gas channels 10 not covered by the stage 3, the flow path of the air is guided through the gas channels 10 provided in the base, which is schematically indicated by the term "open" in FIG. 8.

Although the invention has been illustrated with reference to embodiments where the movable stage is a stage for holding a substrate in the photolithographic apparatus, the skilled person will easily recognize that the invention is also applicable in embodiments where the movable stage is for holding a reticle, or wherein both reticle and substrate stages are designed according to the invention. Furthermore, in the application, the contactless measuring devices are illustrated in the form of interferometric measurement devices. However, other type of contactless measurement devices, such as capacitive sensors, optical level sensors, stage and wafer alignment sensors and optical image sensors may benefit from the invention, and as such fall within the scope of the appended claims. Furthermore, in the context of this application, the term "pump" is used for any air stream generating structure that is able to create a gas flow. In this context, any pump may used to either propel or suck the gas flow, depending on a particular flow path desired. In particular, the flow paths illustrated may be reversed equally without falling out the scope of the claims.

While specific embodiments of the invention have been described above, it will be appreciated that the invention may be practiced otherwise than as described. The description is not intended to limit the invention.

What is claimed is:

1. An apparatus configured to position a workpiece, the apparatus comprising:
   a planar base;
   a movable stage configured to support said workpiece, the stage being configured to be moved over said planar base;
   an actuator configured to move said stage;
   a contactless position measurer configured to measure a position of said stage; and
   a first pump configured to generate a conditioned gas flow in a volume between said measurer and said stage,
   wherein said base comprises a plurality of gas channels provided in said base that provide a path for said conditioned gas flow through said base.

2. The apparatus of claim 1, wherein said gas channels are connected to a second pump constructed and arranged to remove gas from said channels.

3. The apparatus of claim 2, wherein said stage is provided with a third pump constructed and arranged to remove gas from between said stage and said base.

4. The apparatus of claim 3, wherein any of said pumps are arranged to provide a gas flow speed between said stage and said base that is higher than the maximum speed of the stage on said base.

5. The apparatus of claim 3, wherein said gas channels in said base are provided with valves arranged to close due to suction of said third pump.

6. The apparatus of claim 3, wherein any of said pumps are so connected as to provide a closed-loop air shower.

7. The apparatus of claim 6, wherein said base and said stage are contained in a closed environment, and wherein cooling and/or purifying devices are coupled between any of said pumps.

8. The apparatus of claim 1, wherein said stage is provided with a second pump constructed and arranged to remove gas from between said stage and said base.

9. The apparatus of claim 8, wherein any of said pumps are arranged to provide a gas flow speed between said stage and said base that is higher than the maximum speed of the stage on said base.

10. The apparatus of claim 1, wherein said gas channels are provided in a regular pattern across substantially the whole planar base.

11. The apparatus of claim 1, wherein the gas flow is oriented perpendicular to said base.

12. The apparatus of claim 1, wherein said measurer is an interferometer providing a measuring beam parallel to said base.

13. The apparatus of claim 1, wherein said actuator comprises a planar electromagnetic motor.

14. The apparatus of claim 13, wherein said planar electromagnetic motor comprises a stator coupled to said base, and a translator movable relative to said stator and coupled to said stage in order to provide a movement of the stage by electromagnetic forces wherein at least one of said stator and said translator comprises a grid of magnets and/or electric wiring wherein said gas channels are provided on preselected corners of said grid.

15. The apparatus of claim 1, wherein said stage is provided with a further pump in order to provide an air bearing between said stage and said base.

* * * * *